US006889447B2

United States Patent
Lee et al.

(10) Patent No.: US 6,889,447 B2
(45) Date of Patent: May 10, 2005

(54) METHOD FOR DRYING A WAFER AND APPARATUS FOR PERFORMING THE SAME

(75) Inventors: Kwang-Wook Lee, Seongnam-si (KR); Yong-Sun Ko, Suwon-si (KR); In-Seak Hwang, Suwon-si (KR)

(73) Assignee: Samsung Electronics Co., Ltd., Kyungki-do (KR)

( * ) Notice: Subject to any disclaimer, the term of this patent is extended or adjusted under 35 U.S.C. 154(b) by 0 days.

(21) Appl. No.: 10/464,639

(22) Filed: Jun. 19, 2003

(65) Prior Publication Data

US 2003/0233764 A1 Dec. 25, 2003

(30) Foreign Application Priority Data

Jun. 20, 2002 (KR) ........................................ 2002-34552

(51) Int. Cl.[7] .................................................. F26B 5/04
(52) U.S. Cl. ............................ 34/403; 34/404; 34/410; 34/263; 34/264; 34/406; 34/92
(58) Field of Search .......................... 34/403, 404, 410, 34/263, 264, 259, 406, 22, 92

(56) References Cited

U.S. PATENT DOCUMENTS

| | | | | |
|---|---|---|---|---|
| 5,174,042 A | * | 12/1992 | Tomizawa et al. ............. | 34/259 |
| 5,655,313 A | * | 8/1997 | Hope et al. .................... | 34/323 |
| 5,820,692 A | * | 10/1998 | Baecker et al. ................ | 134/21 |
| 5,855,077 A | * | 1/1999 | Nam et al. ..................... | 34/409 |
| 6,286,524 B1 | | 9/2001 | Okuchi et al. ............. | 134/95.2 |
| 6,357,142 B1 | * | 3/2002 | Bergman et al. .............. | 34/410 |
| 6,537,927 B1 | * | 3/2003 | Son ............................. | 438/771 |

FOREIGN PATENT DOCUMENTS

| | | | | |
|---|---|---|---|---|
| GB | | 0423377 A1 | * 4/1991 | ............. F26B/5/04 |
| KR | (10) | 2002-1386 | 1/2002 | |

* cited by examiner

Primary Examiner—Kenneth Rinehart
(74) Attorney, Agent, or Firm—Lee, Sterba & Morse P.C.

(57) ABSTRACT

An instantaneous pressure reducing heating and drying apparatus for an object, such as a wafer, includes a pressure reducing chamber; a vacuum pump for reducing a pressure in the pressure reducing chamber to below atmospheric pressure; a drying chamber installed within the pressure reducing chamber for drying the object that is loaded in the drying chamber; a pressure regulating valve installed in a wall of the drying chamber, wherein when the pressure regulating valve is opened a pressure in the drying chamber is instantaneously reduced to the pressure of the pressure reducing chamber; and a heating means for heating the drying chamber. In operation, the vacuum pump reduces a pressure of the pressure reducing chamber to below atmospheric pressure, and the pressure regulating valve installed in a wall of the drying chamber opens thereby instantaneously reducing the pressure the drying chamber to the reduced pressure of the pressure reducing chamber.

20 Claims, 5 Drawing Sheets

METHOD FOR DRYING A WAFER AND APPARATUS FOR PERFORMING THE SAME

BACKGROUND OF THE INVENTION

1. Field of the Invention

The present invention relates to a method for drying a wafer and an apparatus for performing the same. More particularly, the present invention relates to a method for drying a wafer after a rinsing operation by instantaneously reducing the pressure in a drying chamber in order to dry a wafer without forming watermarks and an apparatus for performing the method.

2. Description of the Related Art

In semiconductor manufacturing technology, particles transcribed on a wafer or impurities remaining on a wafer are generally removed from the wafer by rinsing the wafer with chemicals during a wet rinsing process and then drying the wafer. Alternatively, particles or impurities may be conventionally removed from a wafer by applying deionized water onto the wafer using an ultrasonic wave or a brush while rotating the wafer.

After the wafer is rinsed with the deionized water, the wafer is dried using a spin drying process, an isopropyl alcohol (IPA) vapor drying process, or a Marangoni drying process in order to remove the deionized water remaining on the wafer.

In a spin drying process, water particles on a wafer are expelled from the wafer due to a rotational force resulting from the wafer being rotated at a high speed. In an IPA vapor drying process, IPA vapor at a high temperature is applied to the wafer loaded in a sealed drying chamber, and then the water particles on the wafer are substituted with the IPA and then the IPA on the wafer is naturally removed from the wafer. In a Marangoni drying process, water particles remaining on a wafer are removed due to the Marangoni force while the wafer immersed in deionized water is lifted into an atmosphere including IPA and water particles are slowly drained from the wafer exposed to an atmosphere including IPA.

The above-mentioned conventional drying processes, however, have several disadvantages. As for the spin drying process, watermarks may be generated on a film surface simultaneously having hydrophobicity and hydrophilicity characteristics and main patterns of the film may not be completely dried even though the wafer has been through the spin drying process. Additionally, in a memory device having a storage node polysilicon structure, such as DRAM device, storage polysilicon films may be attached to each other due to the surface tension of the water on the wafer.

During an IPA vapor drying process, a defect such as the formation of gels may occur on the wafer or storage polysilicon films may be cohered to each other.

Furthermore, in a Marangoni drying process, the time for drying the wafer is too long, and storage polysilicon films may be also cohered to each other when the drying process is not precisely executed under exact processing conditions.

One common disadvantage of these conventional drying processes is that particles remaining on the wafer may not be completely removed from the wafer during the drying processes. On the other hand, other particles may be newly formed on the wafer during the drying processes in addition to the presence of the previously remaining particle. In addition, if isopropyl alcohol is used in the drying of the wafer, a carbon environmental pollution may occur in the isopropyl alcohol.

SUMMARY OF THE INVENTION

In order to overcome above-mentioned problems, it is a first feature of an embodiment of the present invention to provide an instantaneous pressure reducing heating and drying apparatus and a method for drying a wafer using the same, which can instantaneously dry and evaporate water particles remaining on the wafer by instantaneously reducing a pressure of a drying chamber using a pressure regulating valve installed between the drying chamber and a pressure reducing chamber.

It is a second feature of an embodiment of the present invention to provide an instantaneous pressure reducing heating and drying apparatus and a method for drying a wafer using the same, which can remove water particles from the wafer by instantaneously evaporating water on the wafer.

In order to provide the features of the present invention, according to one preferred embodiment of the present invention, there is provided an apparatus for drying an object comprising: a pressure reducing chamber; a vacuum pump for reducing a pressure in the pressure reducing chamber to below atmospheric pressure; a drying chamber installed within the pressure reducing chamber for drying the object that is loaded in the drying chamber; a pressure regulating valve installed in a wall of the drying chamber, wherein when the pressure regulating valve is opened a pressure in the drying chamber is instantaneously reduced to the pressure of the pressure reducing chamber; and a heating means for heating the drying chamber.

Preferably, the pressure regulating valve is a plurality of the pressure regulating valves disposed adjacent to the object, and wherein the pressure regulating valves function to open or close penetration holes arranged along the object loaded in a vertical direction.

The heating means may further include a microwave generator; and a wave guide for guiding a microwave generated from the microwave generator into the drying chamber or it may include at least one heating lamp installed in the drying chamber.

In the case where the heating means is a microwave generator, the microwave generator generates a microwave having a frequency of approximately 2.45 GHz, or generates a microwave having a specific frequency selected from the range of frequencies between approximately 400 MHz to 40 GHz and the microwave generator has a power of no less than approximately 1.5 kW.

Preferably, the wall of the drying chamber includes a metal coated with a chemical resistant coating agent. The chemical resistant coating agent is preferably selected from the group consisting of Teflon, quartz and a mixture thereof.

The apparatus may further include a purifying gas supplying means for supplying a purifying gas to the drying chamber to stabilize the pressure of the drying chamber at atmospheric pressure, wherein the purifying gas is preferably a nitrogen gas or an insert gas. The apparatus may also further include a draining means for draining a rinsing solution from the drying chamber. The apparatus may also include a rinsing solution supplying means for supplying the rinsing solution into the drying chamber.

To provide the feature of the present invention, there is provided a method for drying a surface of an object including placing and containing the object in a pressure chamber, and simultaneously and instantaneously reducing a pressure in the pressure chamber while heating the object contained in the pressure chamber so as to dry the surface of the object by instantaneous evaporation of water particles on the surface of the object.

To provide another feature of the present invention, there is provided a method for drying a surface of an object including loading and containing the object in an inner pressure bath, wherein the inner pressure bath is surrounded by an outer pressure bath and communicates with the outer pressure bath by a pressure regulating valve; establishing a pressure in the outer pressure bath below atmospheric pressure by reducing the pressure in the outer pressure bath; heating the object in the inner pressure bath; opening the pressure regulating valve to instantaneously reduce a pressure in the inner pressure bath thereby instantaneously evaporating water particles remaining on the surface of the object; closing the pressure regulating valve after the surface of the object is dried; stabilizing the pressure in the inner pressure bath to atmospheric pressure by supplying a purifying gas into the inner pressure bath; and unloading the dried object from the inner pressure bath.

The above method may further include supplying the inner pressure bath with a rinsing solution after loading the object; rinsing the surface of the object with the rinsing solution; and draining the rinsing solution from the inner pressure bath.

In the above method, wherein the purifying gas may be previously supplied before closing the pressure regulating valve in order to exhaust any remaining water vapor or particles from the inner pressure bath to the outer pressure bath, wherein the purifying gas preferably includes a nitrogen gas or an inert gas.

The above method may further include maintaining a reduced pressure in the inner pressure bath by continuously pumping out air from the inner pressure bath after opening the pressure regulating valve. The above method may also further include continuously heating the inner pressure bath after opening the pressure regulating valve. The continuous heating may be performed by a microwave generator or by at least one heating lamp in the inner pressure bath.

According to the present invention, a time for drying a wafer can be reduced because the water particles on the wafer are instantaneously evaporated by the abrupt reduction of the boiling point of the water on the wafer caused by the instantaneous pressure reduction of the drying chamber. In addition, the generation of defects, such as watermarks, can be prevented, and particles remaining on the wafer are easily removed.

BRIEF DESCRIPTION OF THE DRAWINGS

The above and other features and advantages of the present invention will become more apparent to those of ordinary skill in the art by describing in detail preferred embodiments thereof with reference to the attached drawings in which.

DETAILED DESCRIPTION OF THE INVENTION

Korean Patent Application No. 2002-34552, filed on Jun. 20, 2002, and entitled: "Method of Drying a Wafer and Apparatus Performing the Same," is incorporated by reference herein in its entirety.

The present invention will now be described more fully hereinafter with reference to the accompanying drawings, in which preferred embodiments of the invention are shown. The invention may, however, be embodied in different forms and should not be construed as limited to the embodiments set forth herein. Rather, these embodiments are provided so that this disclosure will be thorough and complete, and will fully convey the scope of the invention to those skilled in the art. Like numbers refer to like elements throughout.

Figure 1:
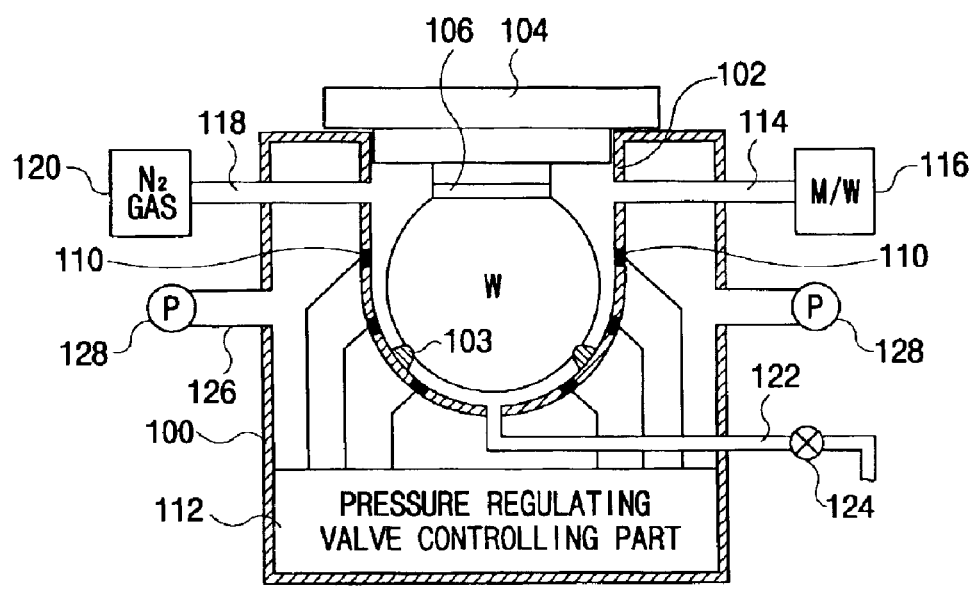
FIG. 1 illustrates a cross-sectional view taken along a horizontal direction of an apparatus for drying a wafer according to a first preferred embodiment of the present invention.
Figure 2:
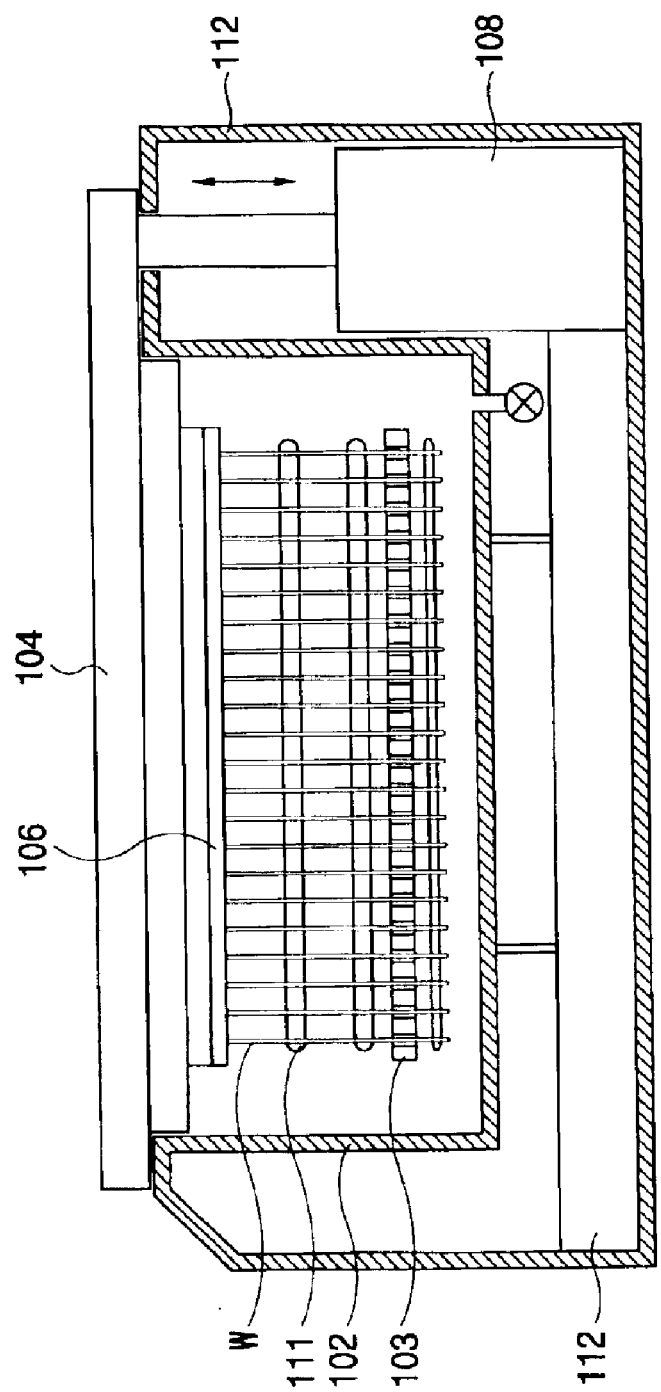
FIG. 2 illustrates a cross-sectional view taken along a vertical direction of the drying apparatus in FIG. 1.

FIG. 1 illustrates a cross-sectional view taken along a horizontal direction of an instantaneous pressure reducing heating and drying apparatus for an object, preferably a wafer, according to a first preferred embodiment of the present invention. FIG. 2 illustrates a cross-sectional view taken along a vertical direction of the instantaneous pressure reducing heating and drying apparatus in FIG. 1.

Referring to FIGS. 1 and 2, the heating and drying apparatus of the present embodiment has a double chamber construction including a pressure reducing chamber 100 (or an outer pressure bath) and a drying chamber 102 (or an inner pressure bath).

A cover 104 for vacuum sealing is disposed on the drying chamber 102, and a wafer holder 106 is installed on an inside of the cover 104. An edge portion of the cover 104 is coupled to an elevator 108 so that the cover 104 is able to move upwardly and downwardly as controlled by the elevator 108.

When the cover 104 is lifted to open the upper portion of the drying chamber 102, a wafer, and preferably scores of wafers W simultaneously, is loaded onto the wafer holder 106 installed beneath the cover 104. If a plurality of wafers is present, the wafers W are serially arranged.

The cover 104 is lowered while the wafers W are held in the wafer holder 106, thereby loading the wafer holder 106 in the drying chamber 102.

The drying chamber 102 is then sealed.

A wall of the drying chamber 102 preferably includes a metal coated with a coating agent, such as Teflon, quartz or a mixture thereof having corrosion and chemical resistances in order to prevent an inside of the dry chamber 102 from being corroded by a rinsing or etching solution dripping from the wafers W.

A guiding member 103 is formed on the wall of the drying chamber 102 such that the guiding member 103 arranges the loaded wafers W at predetermined intervals, and maintains the initial positions of the wafers W.

At least one pressure regulating valve 110, preferably a plurality of pressure regulating valves 110, is installed on the wall of the drying chamber 102. The pressure regulating valves 110 function to open or close penetration holes 111 arranged in a vertical direction. The pressure regulating valves 110 are operated by a pressure regulating valve controlling part 112 installed on a bottom face of the pressure reducing chamber 100. The penetration holes 111 are disposed adjacent to edge portions of the wafers W so that the reduction in pressure is uniformly applied to all of the wafers W through the penetration holes 111 when the pressure of the pressure reducing chamber 100 is instantaneously reduced. Thus, any agitation of the wafers W may be prevented, and the flow of particles and water vapor pumped out of the drying chamber can be improved when the pressure of the pressure reducing chamber 100 is instantaneously reduced.

In this first preferred embodiment of the present invention, a microwave generator 116 is connected to the drying chamber 102 through a wave-guide 114. The microwave generator 116 generates a microwave having a frequency of approximately 2.45 GHz. Alternately, the microwave generator 116 may generate other microwaves having a specific frequency selected from the range of frequencies between approximately 400 MHz to 40 GHz as may be required by a particular drying process. To rapidly dry the wafers W, the microwave generator 116 having a power of no less than approximately 1.5 kW is preferably used. Hence, the microwaves generated from the microwave generator 116 are transferred to the inside of the drying chamber 102 through the wave-guide 114 so that the moisture in the drying chamber 102 is heated with the microwave.

A gas supplying member 120 is connected to the drying chamber 102 through a gas supplying pipe 118. The gas supplying member 120 supplies a gas, such as a nitride ($N_2$) gas or an inert gas into the drying chamber 102 until the gas increases the pressure of the drying chamber 102 to atmospheric pressure. More particularly, the gas supplying member 120 supplies the drying chamber 102 with a purifying gas, such as nitride gas or an inert gas, in order to stabilize the pressure of the drying chamber 102 at atmospheric pressure.

A draining pipe 122 is connected to the bottom face of the drying chamber 102, and a draining valve 124 is installed in the draining pipe 122. When the draining valve 124 is open, the rinsing or etching solution that has dripped to the bottom of the drying chamber 102 is drained from the drying chamber 102.

A vacuum pump 128 is connected to the pressure reducing chamber 100 through an exhausting pipe 126. The vacuum pump 128 exhausts the air in the pressure reducing chamber 100 so that the pressure of the pressure reducing chamber 100 decreases. In addition, when the pressure regulating valves 110 are open, the vacuum pump 128 continuously pumps out any water vapor such that the vacuum pump 128 maintains the conditions of the drying chamber 102 and the pressure reducing chamber 100 when the pressures of each are reduced.

A pressure gauge (not shown) may be installed in the pressure reducing chamber 100 to indicate the pressure of the pressure reducing chamber 100.

A wafer drying process according to the present invention using the drying apparatus as shown in FIGS. 1 and 2 will now be described.

Figure 3:
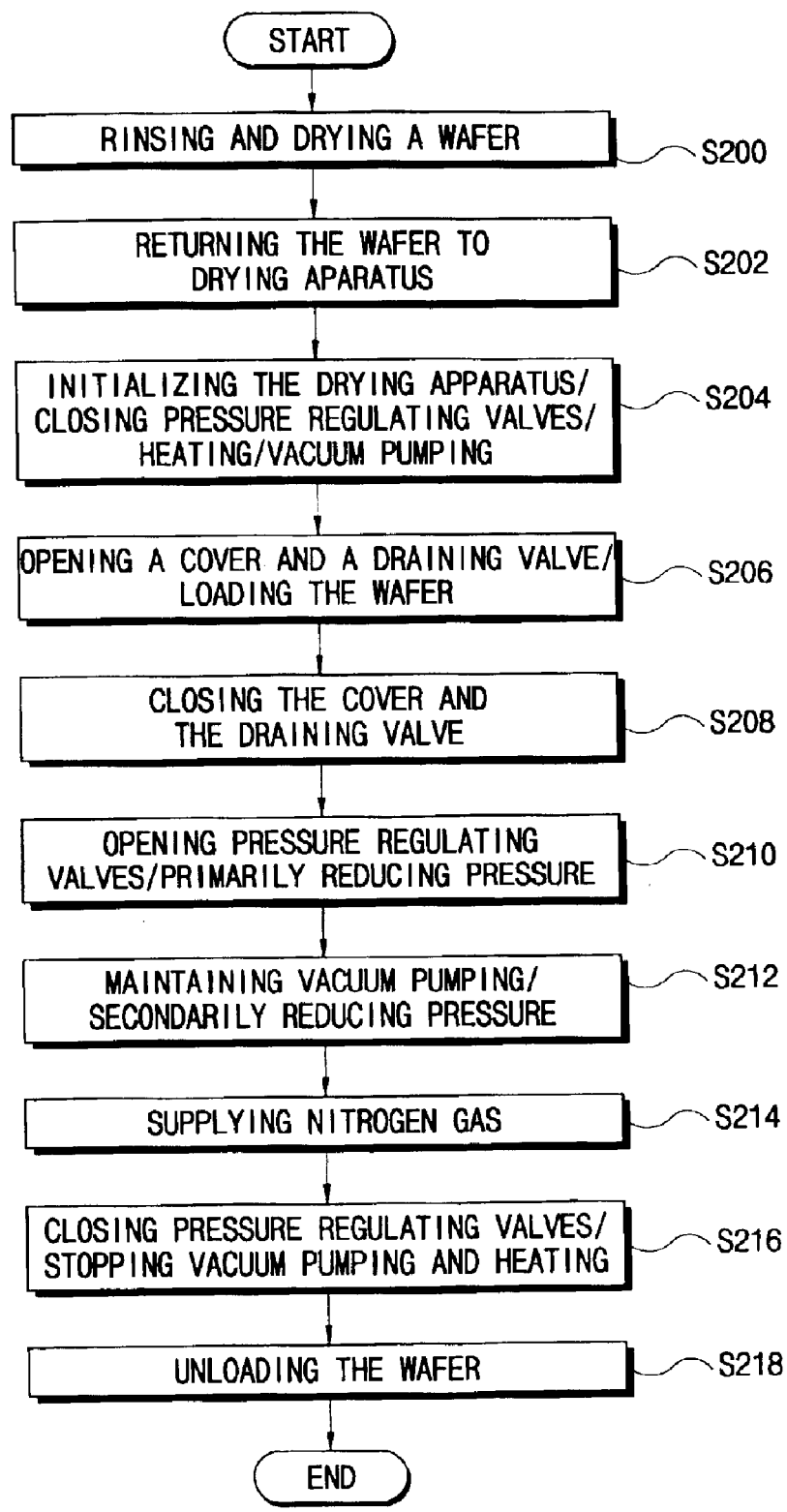
FIG. 3 is a flow chart illustrating a method for drying wafers according to a preferred embodiment of the present invention.

FIG. 3 is a flow chart illustrating a method for drying wafers according to a preferred embodiment of the present invention.

Referring to FIG. 3, in step S200, a wafer W is rinsed through a washing bath and a rinsing bath and initially dried. In step S202, the wafer W is transferred to the drying apparatus in order to completely remove any rinsing solution that may remain on the surface of the wafer.

In step S204, in the drying apparatus, the vacuum pump 128 operates to exhaust the air in the pressure reducing chamber 100 in an initial condition. The initial condition of the pressure reducing chamber 100 is that the pressure regulating valves 110 are closed to isolate the pressure reducing chamber 100 from the drying chamber 102. The vacuum pump 128 exhausts air from the pressure reducing chamber 100 so that the pressing reducing chamber 100 is maintained to have a pressure below atmospheric pressure. In addition, the microwave generator 116 operates to preliminarily heat the drying chamber 102 such that the drying chamber 102 has a predetermined temperature, for example, a temperature of approximately 40 to 60° C.

Then, in step S206, the draining valve 124 opens. When the wafer W is transferred to the drying apparatus, the elevator 108 operates to lift the cover 104 such that the drying chamber 102 is open. A transferring device (not shown) holds the wafer W by loading the wafer W on the wafer holder 106 installed beneath the cover 104.

When the wafer W is held on the wafer holder 106 positioned beneath the cover 104, in step S208, the elevator 108 closes the cover 104 so that the wafer W is completely loaded in the drying chamber 102. The drying chamber 102 is completely sealed by the cover 104. Any rinsing solution that has dripped from the wafer W is exhausted to the outside through the draining pipe 122. When the wafer W is completed loaded in the drying chamber 102, the temperature of the drying chamber 102 is raised just before the rinsing solution remained on the wafer W is evaporated, and then the draining valve 124 is closed.

In step S210, the pressure regulating valves 110 are opened through the pressure regulating valve controlling part 112 just before the rinsing solution is evaporated from the wafer W. At this time, the drying chamber 102 has a predetermined temperature, for example, a temperature of approximately 90 to 100° C.

In step S210, when the pressure regulating valves 110 are open, the air in the drying chamber 102 is dispersed into the pressure reducing chamber 100 such that the pressure of the pressure reducing chamber 100 is instantaneously reduced from atmospheric pressure. Thus, the boiling point of the water particles on the wafer W loaded in the drying chamber 102 is abruptly reduced so that the water particles are instantaneously evaporated from the surface of the wafer W.

Figure 4:
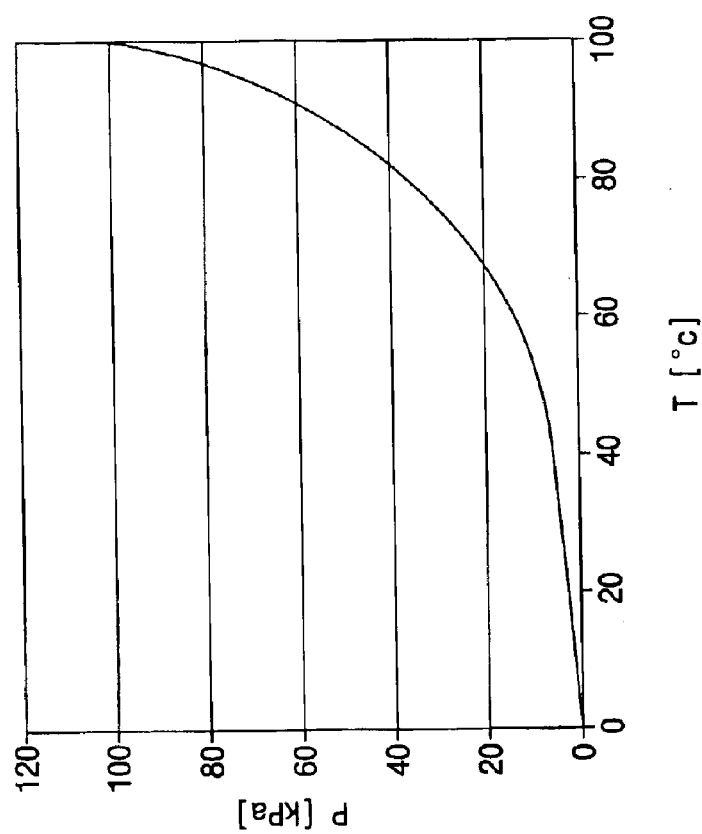
FIG. 4 is a graph showing a vapor pressure of wafer relative to temperature.

FIG. 4 is a graph showing the vapor pressure of wafer relative to the temperature.

As shown in FIG. 4, water has a boiling point of approximately 100° C. under the pressure of one (1) atmosphere (that is, 101.3 KPa). The boiling point of wafer, however, decreases to a temperature of approximately 46.2° C. when the vapor pressure of water is reduced to a pressure of one-tenth atmospheric pressure (namely, 10.13 KPa). In the case of the present invention, the vapor pressure of water is locally and greatly increased such that the particles around the water are also separated from the wafer W. However, the pressure of the drying chamber 102 is abruptly reduced to expand the gas in the drying chamber 102 so that the water or other liquid remaining on the wafer W may be frozen in accordance with the abrupt reduction of the temperature of the drying chamber 102. Hence, the chamber 102 is continuously heated using microwaves generated from the microwave generator 116 to prevent such a problematic occurrence.

Referring back to FIG. 3, the pressure of the pressure reducing chamber 100 increases due to the evaporated water and particles after the primary instantaneous pressure reduction step is performed by opening the pressure regulating valves 110. Thus, to reduce the pressure of the pressure reducing chamber 100, in step S212, a secondary pressure reducing step is executed by continuously operating the vacuum pump 128 for pumping the water vapor and particles in the pressure reducing chamber 100.

When the wafer W is completely dried after a predetermined time, in step S214, a nitrogen gas is supplied to the drying chamber 102 through the gas supplying member 120 to evacuate the water vapor and the particles toward the pressure reducing chamber 100. Then, in step S216, the pressure regulating valves 110 are closed so that the pressure reducing chamber 100 is isolated from the drying chamber 102. In addition, operations of the vacuum pump 128 and the microwave generator 116 are halted when the pressure reducing valves 110 are closed.

In step S218, the wafer W is unloaded from the drying chamber 102 when the pressure of the drying chamber 102 returns to atmospheric pressure due to the nitrogen gas supplied to the drying chamber 102. To unload the wafer W, the cover 104 is lifted by the elevator 108, and then the wafer W held on the wafer holder 106 is returned to the retuning device so that the wafer W is unloaded from the drying chamber 102.

Figure 5:
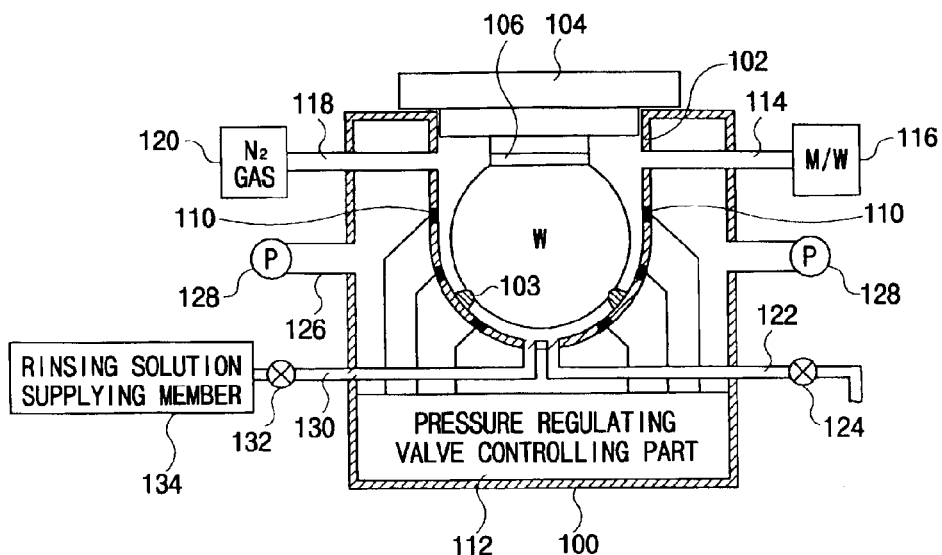
FIG. 5 illustrates a cross-sectional view taken along a horizontal direction of an instantaneous pressure reducing heating and drying apparatus according to a second preferred embodiment of the present invention.

FIG. 5 illustrates a cross-sectional view taken along a horizontal direction of an instantaneous pressure reducing heating and drying apparatus according to a second preferred embodiment of the present invention.

Referring to FIG. 5, the heating and drying apparatus of the second embodiment further includes a rinsing solution supplying member 134 connected to the drying chamber 102 through a rinsing solution supplying pipe 130 and a rinsing solution supplying valve 132 as opposed to the heating and drying apparatus shown in the first preferred embodiment of FIGS. 1 and 2.

In the drying apparatus of the embodiment of the present embodiment, after a rinsing solution or a washing solution is provided in the drying chamber 102 to rinse the wafer W loaded in the drying chamber 102, the rinsing or the washing solution is drained using the draining pipe 122 and the draining valve 124. Hence, the wafer W is dried immediately after rinsing the wafer W.

Figure 6:
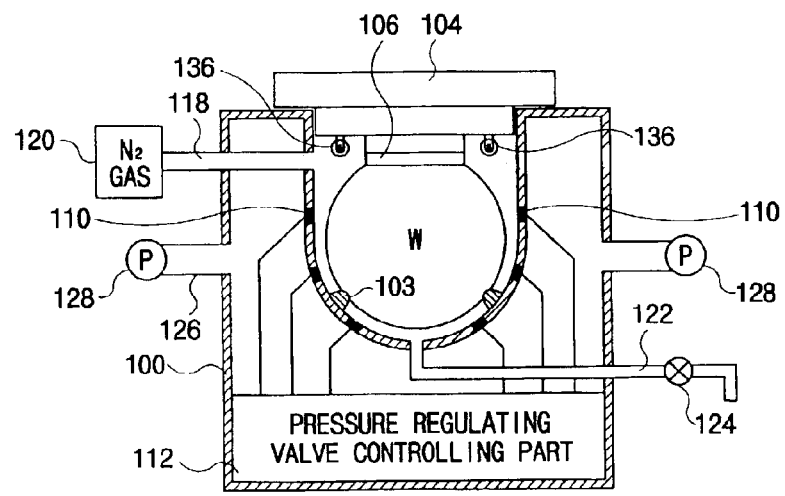
FIG. 6 illustrates a cross-sectional view taken along a horizontal direction of an instantaneous pressure reducing heating and drying apparatus according to a third preferred embodiment of the present invention.

FIG. 6 illustrates a cross-sectional view taken along a horizontal direction of an instantaneous pressure reducing heating and drying apparatus according to a third preferred embodiment of the present invention.

Referring to FIG. 6, the heating and drying apparatus of the third embodiment includes a heating lamp 136 instead of a microwave generator 116 in FIG. 1 to heat the drying chamber 102.

A heating and drying apparatus according to the present invention has a dual chamber construction including the pressure reducing chamber having a previously reduced pressure and the drying chamber disposed within the pressure reducing chamber. In operation, the drying chamber can be instantaneously evacuated by abruptly opening pressure regulating valves installed between the pressure reducing chamber and the drying chamber. Then, any water remaining on the wafer can be instantaneously evaporated from the wafer due to the reduction of the boiling point of the water so that the wafer can be dried.

Thus, a generation of defects, such as watermarks or the formation of the gel, is prevented as the particles on the wafer are removed by the instantaneous evaporation of the water.

In addition, a time for drying a wafer may be shortened and environmental pollution can be prevented since chemicals like isopropyl alcohol are not present. Furthermore, a failure, such as a bridge failure of a storage poly of a semiconductor device, can be prevented because the surface tension of the water can be reduced through boiling the water remaining on the wafer.

Preferred embodiments of the present invention have been disclosed herein and, although specific terms are employed, they are used and are to be interpreted in a generic and descriptive sense only and not for purpose of limitation. Accordingly, it will be understood by those of ordinary skill in the art that various changes in form and details may be made without departing from the spirit and scope of the present invention as set forth in the following claims.

What is claimed is:

1. An apparatus for drying an objects comprising:
   a pressure reducing chamber;
   a vacuum pump for reducing a pressure in the pressure reducing chamber to below atmospheric pressure;
   a drying chamber installed within the pressure reducing chamber for drying the object that is loaded in the drying chamber;
   a pressure regulating valve installed in a wall of the drying chamber, wherein when the pressure regulating valve is opened a pressure in the drying chamber is instantaneously reduced to the pressure of the pressure reducing chamber, the pressure regulating valve being a plurality of pressure regulating valves disposed adjacent to the object, wherein the pressure regulating valves function to open or close penetration holes arranged along the object loaded in a vertical direction; and
   a heating means for heating the drying chamber.

2. The apparatus as claimed in claim 1, wherein the heating means further comprises:
   a microwave generator; and
   a wave guide for guiding a microwave generated from the microwave generator into the drying chamber.

3. The apparatus as claimed in claim 2, wherein the microwave generator generates a microwave having a frequency of approximately 2.45 GHz.

4. The apparatus as claimed in claim 2, wherein the microwave generator generates a microwave having a specific frequency selected from the range of frequencies between approximately 400 MHz to 40 GHz.

5. The apparatus as claimed in claim 2, wherein the microwave generator has a power of no less than approximately 1.5 kW.

6. The apparatus as claimed in claim 2, wherein the wall drying chamber includes a metal coated with a chemical resistant coating agent.

7. The apparatus as claimed in claim 6, wherein the resistant coating agent is selected from the group consisting of Teflon, quartz and a mixture thereof.

8. The apparatus as claimed in claim 1, wherein the heating means includes at least one heating lamp installed in the drying chamber.

9. The apparatus as claimed in claim 1, further comprising:
   a purifying gas supplying means for supplying a purifying gas to the drying chamber to stabilize the pressure of the drying chamber at atmospheric pressure.

10. The apparatus as claimed in claim 9, wherein the purifying gas includes a nitrogen gas or an inert gas.

11. The apparatus as claimed in claim 1, further comprising:
    a draining means for draining a rinsing solution from the drying chamber.

12. The apparatus as claimed in claim 11, further comprising:
a rinsing solution supplying means for supplying the rinsing solution into the drying chamber.

13. A method for drying a surface of an object, comprising:
loading and containing the object in an inner pressure bath, wherein the inner pressure bath is surrounded by an outer pressure bath and communicates with the outer pressure bath by a pressure regulating valve;
establishing a pressure in the outer pressure bath below atmospheric pressure by reducing the pressure in the outer pressure bath;
heating the object in the inner pressure bath;
opening the pressure regulating valve to instantaneously reduce a pressure in the inner pressure bath thereby instantaneously evaporating water particles remaining on the surface of the object;
closing the pressure regulating valve after the surface of the object is dried;
stabilizing the pressure in the inner pressure bath to atmospheric pressure by supplying a purifying gas into the inner pressure bath; and
unloading the dried object from the inner pressure bath.

14. The method for drying a surface of an object as claimed in claim 13, further comprising:
supplying the inner pressure bath with a rinsing solution after loading the object;
rinsing the surface of the object with the rinsing solution; and
draining the rinsing solution from the inner pressure bath.

15. The method for drying a surface of an object as claimed in claim 13, wherein the purifying gas is previously supplied before closing the pressure regulating valve in order to exhaust any remaining water vapor or particles from the inner pressure bath to the outer pressure bath.

16. The method for drying a surface of an object as claimed in claim 13, wherein the purifying gas includes a nitrogen gas or an inert gas.

17. The method for drying a surface of an object as claimed in claim 13, further comprising:
maintaining a reduced pressure in the inner pressure bath by continuously pumping out air from the inner pressure bath after opening the pressure regulating valve.

18. The method for drying a surface of an object as claimed in claim 13, further comprising:
continuously heating the inner pressure bath after opening the pressure regulating valve.

19. The method for drying a surface of an object as claimed in claim 18, wherein the continuous heating is performed by a microwave generator.

20. The method for drying a surface of an object as claimed in claim 13, wherein the continuous heating is performed by at least one heating lamp in the inner pressure bath.

* * * * *